(12) United States Patent
Hino et al.

(10) Patent No.: US 10,852,648 B2
(45) Date of Patent: Dec. 1, 2020

(54) MASK PATTERN CORRECTION SYSTEM, AND SEMICONDUCTOR DEVICE MANUFACTURING METHOD UTILIZING SAID CORRECTION SYSTEM

(71) Applicant: TOSHIBA MEMORY CORPORATION, Tokyo (JP)

(72) Inventors: Kazuyuki Hino, Kanagawa (JP); Hiromitsu Mashita, Tokyo (JP); Masahiro Miyairi, Kanagawa (JP); Hiroshi Yoshimura, Kanagawa (JP); Taiga Uno, Kanagawa (JP); Sachiyo Ito, Kanagawa (JP); Shinichirou Ooki, Kanagawa (JP); Kenji Shiraishi, Kanagawa (JP); Hirotaka Ichikawa, Kanagawa (JP); Yuto Takeuchi, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/566,363

(22) Filed: Sep. 10, 2019

(65) Prior Publication Data
US 2020/0117104 A1 Apr. 16, 2020

(30) Foreign Application Priority Data
Oct. 10, 2018 (JP) .................. 2018-191384

(51) Int. Cl.
*G03F 7/20* (2006.01)
*G03F 1/00* (2012.01)
(Continued)

(52) U.S. Cl.
CPC .......... *G03F 7/70783* (2013.01); *G03F 1/144* (2013.01); *G03F 1/72* (2013.01); *G06F 30/23* (2020.01); *G06F 30/30* (2020.01)

(58) Field of Classification Search
USPC ............................................... 716/53
See application file for complete search history.

(56) References Cited

U.S. PATENT DOCUMENTS

| 7,921,401 B2 | 4/2011 | Ito et al. |
| 2015/0120216 A1 | 4/2015 | Vukkadala et al. |

FOREIGN PATENT DOCUMENTS

| JP | H09326349 A | 12/1997 |
| JP | 2007213269 A | 8/2007 |

OTHER PUBLICATIONS

I. Stobert, et al., "Model-based correction for local stress-induced overlay errors", Globalfoundries, Inc., SPIE, vol. 10587, 2018.

*Primary Examiner* — Mohammed Alam
(74) *Attorney, Agent, or Firm* — Holtz, Holtz & Volek PC

(57) ABSTRACT

According to one embodiment, a mask pattern correction system includes the following configuration. A stress analysis circuitry divides a layout of a circuit pattern formed using a design mask formed in accordance with mask design data into correction regions, and acquires a displacement amount from the regions. A correction value calculation circuitry calculates a displacement correction value from the displacement amount. A correction map generation circuitry generates a correction map based on a correction value difference of the displacement correction values. A mask position correction circuitry allocates the regions to a layout of the circuit pattern, performs displacement correction of a mask pattern on the design mask by the displacement correction values, and creates a correction mask based on the displacement correction.

18 Claims, 10 Drawing Sheets

(51) Int. Cl.
*G03F 1/72* (2012.01)
*G06F 30/23* (2020.01)
*G06F 30/30* (2020.01)

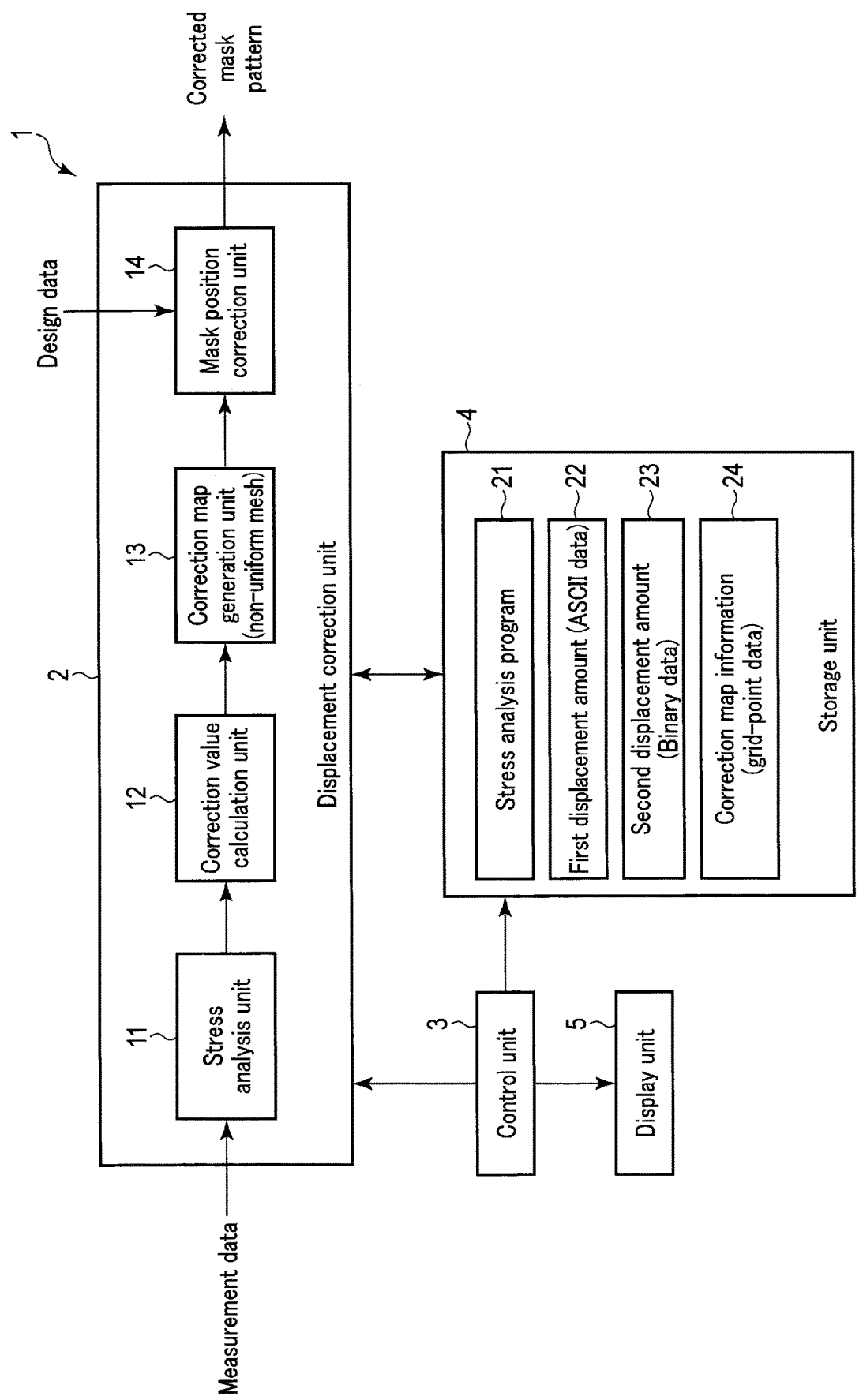
F I G. 1

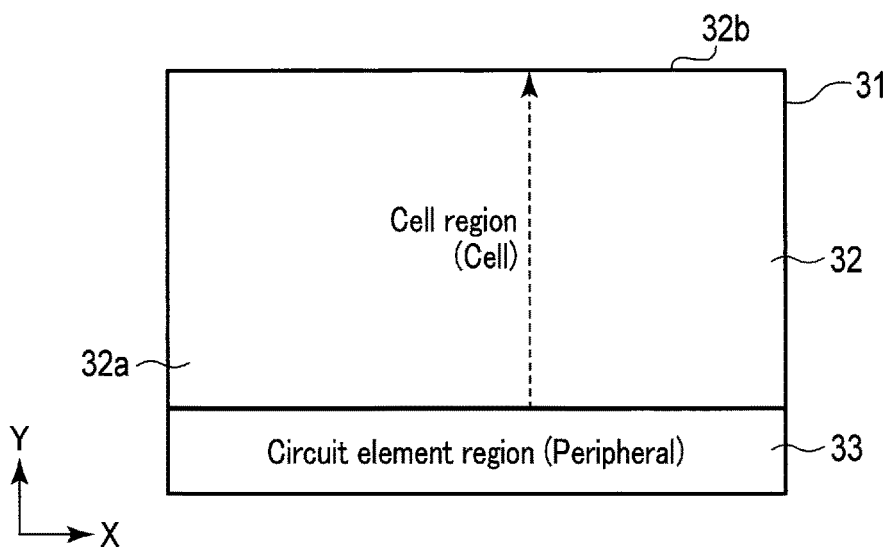
F I G. 3
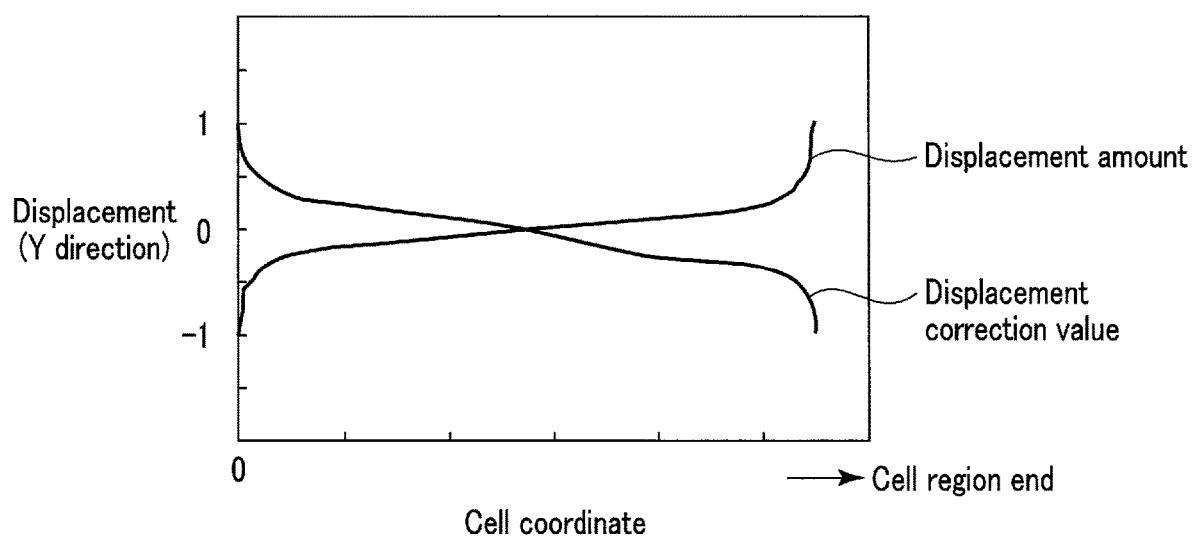
F I G. 4

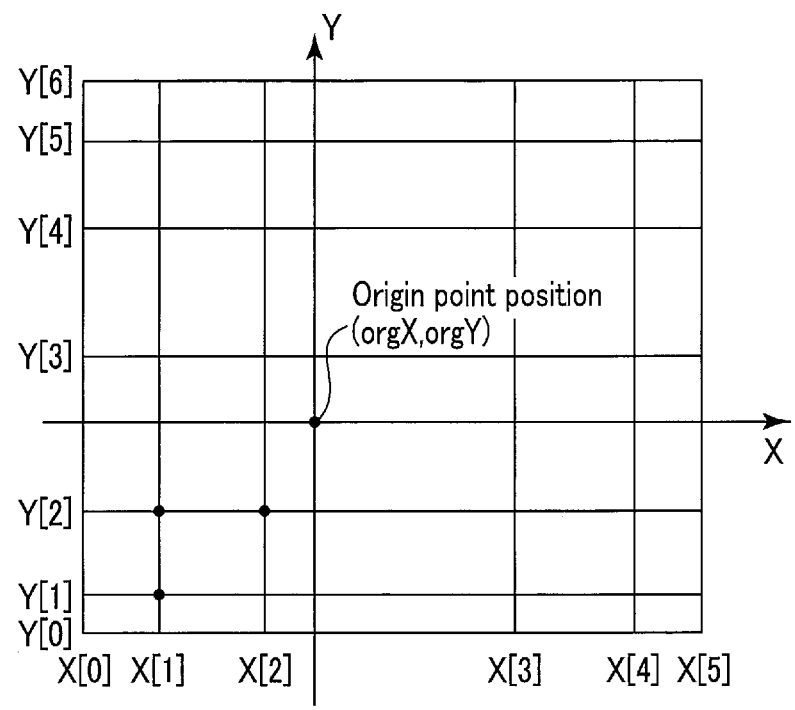
F I G. 5
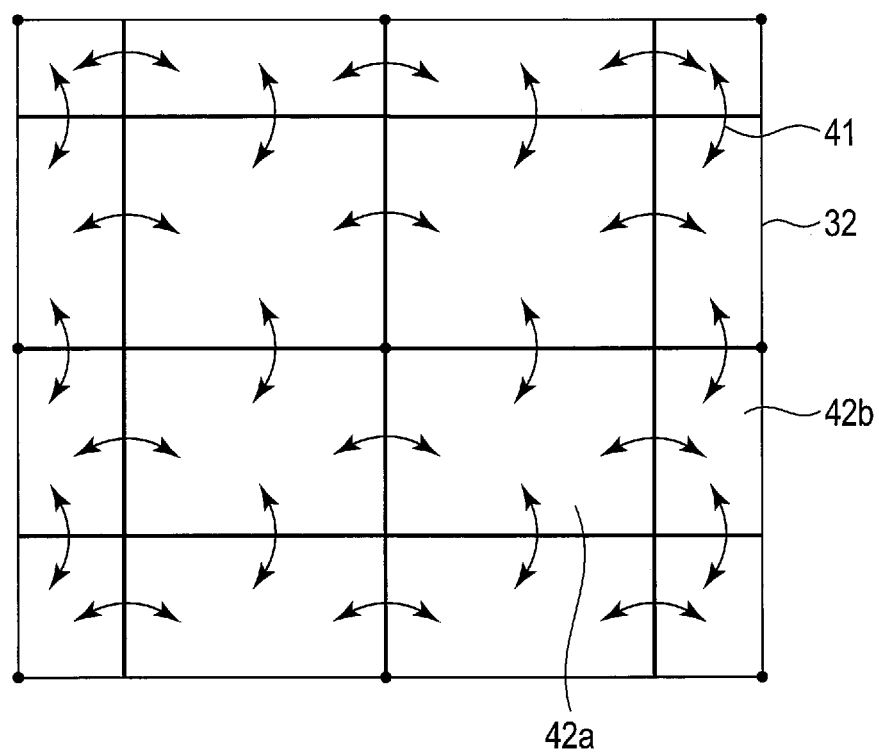
F I G. 6

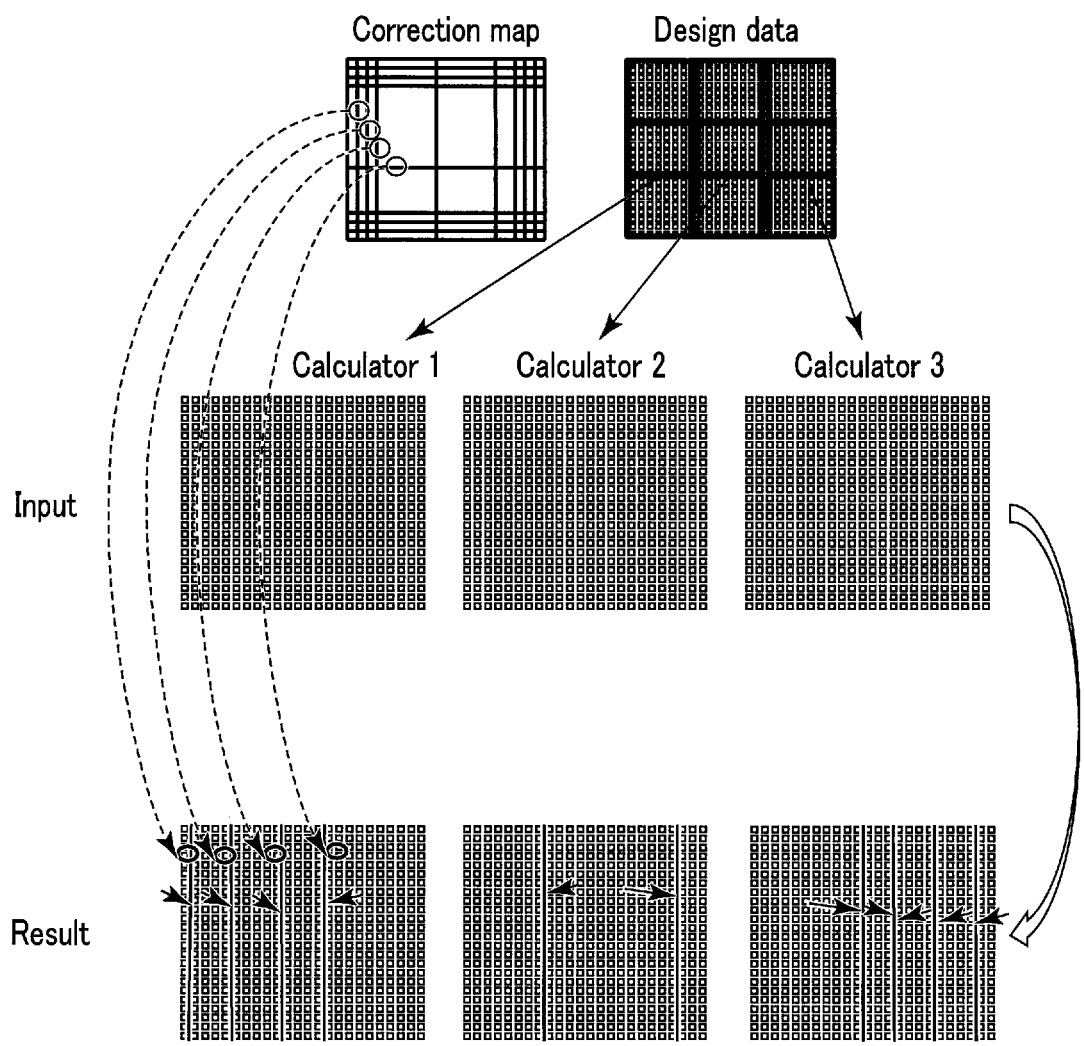
F I G. 12

MASK PATTERN CORRECTION SYSTEM, AND SEMICONDUCTOR DEVICE MANUFACTURING METHOD UTILIZING SAID CORRECTION SYSTEM

CROSS-REFERENCE TO RELATED APPLICATIONS

This application is based upon and claims the benefit of priority from the Japanese Patent Application No. 2018-191384, filed Oct. 10, 2018, the entire contents of which are incorporated herein by reference.

FIELD

Embodiments described herein relate generally to a mask pattern correction system, and a semiconductor device manufacturing method utilizing said correction system.

BACKGROUND

To deal with a displacement of a circuit pattern from a design position owing to stress generated when manufacturing a semiconductor device, a position displacement amount is obtained from a measurement, and a position of a mask pattern is corrected.

BRIEF DESCRIPTION OF THE DRAWINGS

FIG. 1 is a block diagram showing a configuration of a mask pattern correction system according to an embodiment.

FIG. 3 is a diagram for explaining stress generated in a semiconductor memory device.

FIG. 4 is a diagram showing an example of a measured displacement amount.

FIG. 5 is a diagram for explaining a data size in Binary format.

FIG. 6 is a diagram for explaining a comparison of correction value differences in order to set a correction region (mesh) based on a displacement correction value for stress obtained from stress analysis.

FIG. 12 is a diagram showing an example of processing by fitting a correction region of table data to mask design data.

DETAILED DESCRIPTION

Figure 2:
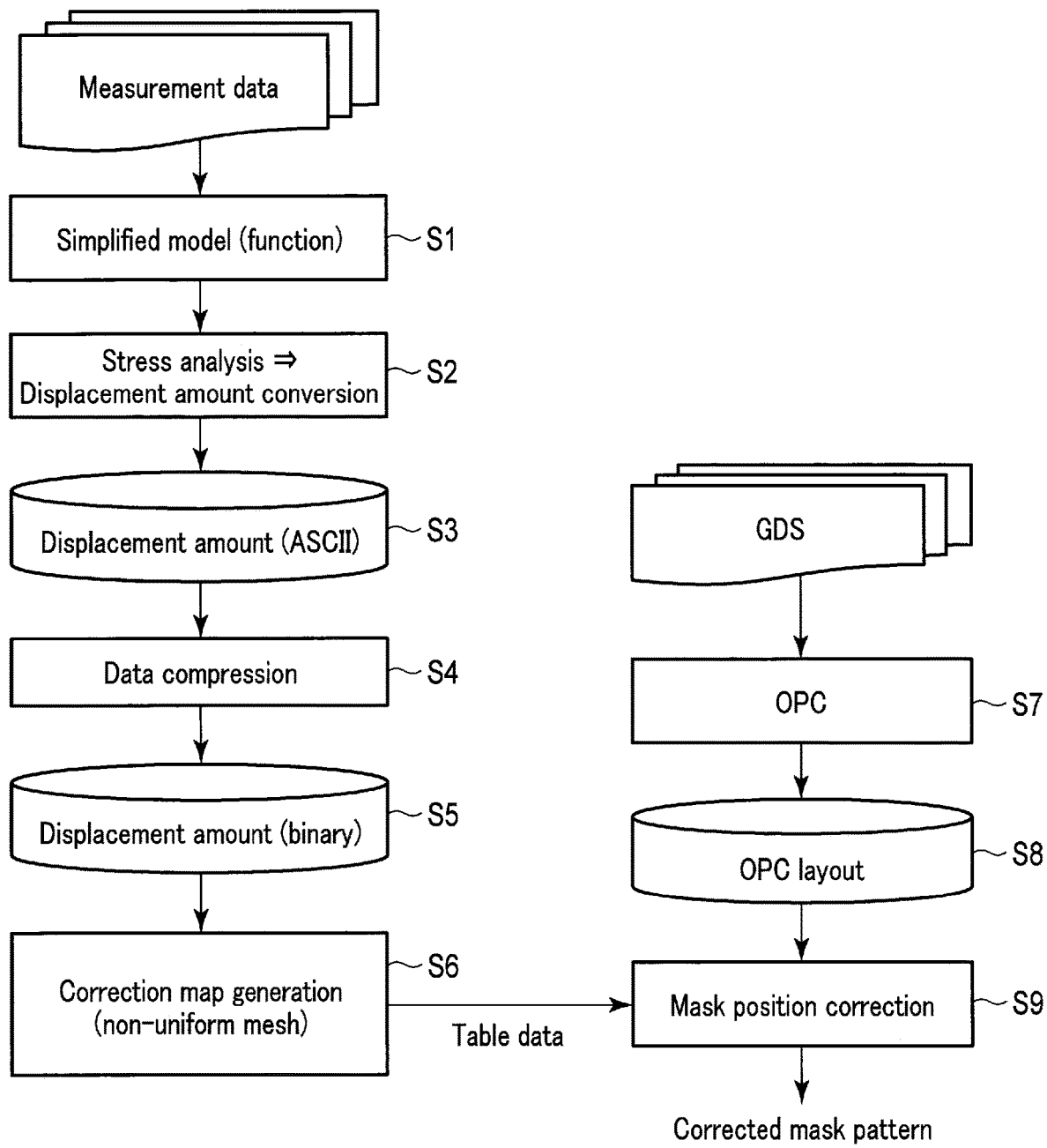
FIG. 2 is a diagram explaining a flow for displacement correction of a mask pattern by the mask pattern correction system.

In general, according to one embodiment, a mask pattern correction system includes: a stress analysis circuitry configured to divide a layout of a first circuit pattern formed on a substrate using a design photo mask formed in accordance with mask design data into a plurality of correction regions, and to acquire a displacement amount by a stress analysis from measurement data including position information of the correction regions; a correction value calculation circuitry configured to calculate a displacement correction value in the correction regions from the displacement amount; a correction map generation circuitry configured to generate a correction map including the correction regions based on a first correction value difference of the displacement correction values between the correction regions that are mutually adjacent in the correction regions; and a mask position correcting circuitry configured to allocate the correction regions in the correction map to a layout of the first circuit pattern, to perform displacement correction of a mask pattern on the design photo mask by the displacement correction values, and to create a correction photo mask based on the displacement correction.

Hereinafter, embodiments will be explained with reference to the accompanying drawings. In the following descriptions, each function block can be implemented in the form of hardware (or circuit), computer software, or a combination thereof. The function blocks need not be categorized as in the example described below. For example, part of the functions may be implemented by a function block other than the exemplary function blocks. In addition, the exemplary function blocks may be further divided into function sub-blocks.

FIG. 1 shows a mask pattern correction system according to an embodiment. In the explanations below, structural elements having similar functions and configurations will be denoted by the same reference symbols, and detailed descriptions thereof will be omitted. A semiconductor device is manufactured by using a mask pattern corrected by the mask pattern correction system according to the present embodiment. The semiconductor device includes, for example, a semiconductor memory device. A mask pattern, and a pattern within a circuit pattern, to be described in the present embodiment below is of a type (design, layout) for forming an interconnect, a structural element (e.g., source, drain, or grid, etc.) of a circuit element, and an insulating film (inter-layer insulating film, element isolation region, etc.), etc. The circuit pattern may suggest an interconnect, a structural element of a circuit element, or an insulating film, formed on a semiconductor substrate.

Usually, when manufacturing a semiconductor device, through the action of stress due to expansion and contraction by heat processing, etc. or stress caused by materials used for a lamination structure of the semiconductor device, displacement occurs in a circuit pattern for every layer of the semiconductor device. The mask pattern correction system according to the present embodiment is applied to a manufacturing technique of a semiconductor device that provides a mask pattern, displacement of which has been corrected, so that a circuit pattern formed on an upper layer, or a circuit pattern formed in a plurality of times of process steps within a layer of the same height, matches a circuit pattern in which displacement occurs for every layer formed on a semiconductor substrate.

Since the displacement of the circuit pattern occurs in a direction in which stress is applied, the displacement occurs in a main surface direction (X-Y direction) and a height direction (Z direction) of the semiconductor substrate. In addition, if the displacement of the circuit pattern occurs within a certain range in a systematic manner, said displacement can be corrected by correcting original mask design data and changing the layout of the mask pattern so that the positions to form the circuit elements and interconnects move in accordance with the displacement amounts.

A mask pattern correction system 1 includes a displacement correction unit 2, a control unit 3, a storage unit 4, and a display unit 5. Although not shown, the system also includes a communication unit for communicating with the other devices, and an input unit for performing information input and various settings. The mask pattern correction system 1 can be realized by using a personal computer, a processing program of stress analysis, a processing program of data format conversion and non-uniform mesh correction map generation, and a processing program of allocating a correction region to mask design data.

First, the control unit 3 includes a hardware processor that performs various kinds of control instructions and arithmetic processing, e.g., a CPU (Central Processing Unit), a RAM (Random Access Memory) that stores data, etc. in a rewritable/readable manner, a ROM (Read Only Memory), etc. The control unit 3 controls operations of the entire system including the displacement correction unit 2, the storage unit 4, and the display unit 5. The CPU executes each aforementioned processing program and data format conversion.

The displacement correction unit 2 analyzes and detects displacement amounts (pattern displacement amounts) by stress simulation from measurement data obtained by measuring a plurality of points on a circuit pattern, including circuit elements and interconnects formed on a target substrate, and generates, as a correction map, displacement correction values (displacement correction amounts) for the displacement amounts. By changing original mask design data, i.e., a layout of a mask pattern based on a design value (in turn based on the correction map), a corrected mask pattern with corrected displacement is output. The measurement data is, for example, position information of a portion of a part thin a circuit pattern obtained from image information of a SEM image, etc. For a substrate, for example, a semiconductor substrate, a semiconductor chip, or a glass substrate, etc. can be applied. Herein, a semiconductor substrate is used as an example.

The displacement correction unit 2 includes a stress analysis unit (or a stress analysis circuitry) 11, a correction value calculation unit (or a correction value calculation circuitry) 12, a correction map generation unit (or a correction map generation circuitry) 13, and a mask position correction unit (or a mask position correction circuitry) 14.

First, the stress analysis unit 11 calculates a stress distribution from the measurement data by simulation using a known processing program or software. Next, stress occurring on the semiconductor substrate is converted into a displacement amount from the calculated stress distribution. For example, a semiconductor memory device 31 formed on the semiconductor substrate shown in FIG. 3 is used as an example. The semiconductor memory device 31 is roughly divided into a cell region 32 in which a plurality of memory cells are formed, and a circuit element region 33 in which a circuit element for performing writing and reading is formed. FIG. 4 shows, in the cell region 32, a relationship between a displacement amount indicated by an arrow toward a Y-axis direction from a cell region end 32a to a cell region end 32b of the circuit element region 33 side (cell coordinate 0), and a displacement correction value.

Displacement amount characteristics see displacement tend to become small at the center of the cell region 32 and increase toward a peripheral portion of the cell region 32. In an example shown in FIG. 4, in the cell coordinate, the displacement amount changes abruptly in 10% of the cell region on both sides of the measurement range, and the displacement amount on both sides of the measurement range accounts for 70% or more (herein, the maximum displacement amounts are 1, −1) of the displacement amount. The displacement amount of a change in the cell region on the inner side of the regions where the steep changes occur shows a gentle linear inclination. Note that a plus/minus sign in the displacement of the vertical axis indicates the direction of the displacement.

In addition, the displacement correction value is a value corresponding to a moving amount (a moving distance and a moving direction (X-Y direction and Z direction)) of changing the layout of the mask pattern so that the positions for forming the interconnects and circuit elements of the circuit pattern in which the displacement occurs, as described above, match those for forming interconnects and circuit elements of a circuit pattern to be formed on the next upper layer, or a layer at the same height. Accordingly, the displacement amount and displacement correction value shown in FIG. 4 have a positive-negative axisymmetric relationship with respect to an axis (Y axis shown in FIG. 3) of the displacement amount of 0 nm.

The correction value calculation unit 12 calculates a displacement correction value from a displacement amount of each correction region to generate a non-uniform mesh (to be described later). The correction value calculation unit 12 performs data compression on the displacement amount data output from the stress analysis unit 11, in a state of text data of a data format such as ASCII format, and converts the file format to Binary data format. This data of the Binary format (Binary data) suggests the general data formats other than the text format, but is used as, for example, data including only information of grid points in the present embodiment. The file format of input data of the displacement amount data is not limited, and may be in the ASCII or Binary file format.

Through such data compression and conversion of the file format, the text data of the ASCII data format, e.g., a data size of 48 GB considered to be a billion rows, is converted to data of 0.05 GB (a mesh shown in FIG. 5) of 8 bits of Binary data format.

Furthermore, the correction value calculation unit 12, for example, calculates the displacement correction value from the displacement amount (Binary data) as shown in FIG. 4.

Figure 9A:
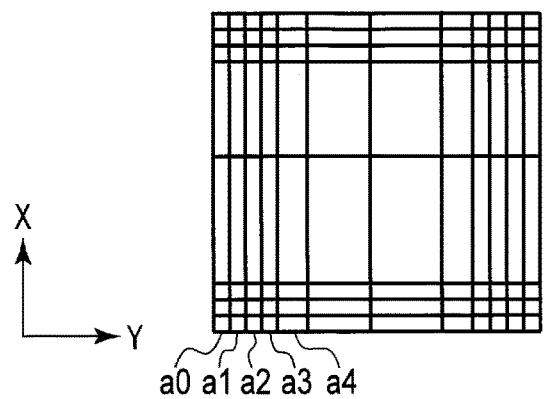
FIG. 9A is a diagram showing a correction map by division of a non-uniform mesh.

The correction map generation unit 13 divides or merges correction regions, based on a difference of displacement correction values between adjacent correction regions, to generate a correction map by a non-uniform mesh shown in FIG. 9A.

The mask position correction unit 14 outputs a mask pattern by a design value, to which OPC (Optical Proximity Correction) processing is applied; specifically, a corrected mask pattern obtained by correcting displacement of mask design data, constituted by design data, via a correction map of a non-uniform mesh.

The storage unit 4 is an auxiliary storage device, such as an HDD (hard disk drive) and an SSD (solid state drive). In the storage unit 4, in addition to a stress analysis program 21 to be described later, a first displacement amount (ASCII data) 22, a second displacement amount (Binary data) 23, and correction map information (coordinate information or grid-point data) 24 are stored. In addition, results of the calculations by the displacement correction unit 2 and the control unit 3 are stored. If the above-described program and displacement amount data, etc. can be stored in a storage unit provided in the control unit 3, the storage unit 4 need not be provided.

The display unit 5 includes, for example, a display screen (e.g., an LCD (liquid crystal display) or an EL (electroluminescence) display, etc.), etc. The display unit 5 displays progress and calculation statuses of the displacement correction executed by the control unit 3 and execution results of the mask pattern position correction.

Next, a flow of the displacement correction of the mask pattern by the mask pattern correction system 1 will be described with reference to FIG. 2.

[Stress Analysis]

First, for a circuit pattern formed on a semiconductor substrate to be a correction target, a plurality of measurement points are set in a matrix form with a constant interval, and each measurement point is measured to acquire measurement data. This measurement data includes position information of a portion (interconnects and circuit elements) at which the circuit pattern is formed. Regarding the number of data (measurement points) of the measurement data, measurement is performed on several thousand or more measurement points with the aid of conventional displacement information obtained without recourse to the stress analysis of the present embodiment. In the present embodiment, if the stress analysis is accurately performed, although depending on the measurement size, the displacement correction can be performed at about 100 measurement points, in contrast to the above-described "several thousand or more" points. In addition, if the accuracy of the stress analysis is not yet sufficient, the accuracy can be improved by data interpolation. Thus, measurement data may be acquired from about a thousand measurement points. Namely, by additionally performing new data interpolation, the precision of the stress analysis can be improved. In this way, by using the stress analysis to perform the displacement correction, it is possible to perform displacement correction with a lower number of measurement data (one-to-several to one-to-several-tens of the conventionally-required numbers of measurement data).

Next, for the acquired measurement data, the stress analysis unit 11, for example, calculates stress distribution in a measurement rage of a circuit pattern by stress simulation (step S1). Furthermore, the stress analysis unit 11 converts stress within the calculated stress distribution into a displacement amount (step S2), This displacement amount is data (text data) in ASCII code. In an example of this displacement data, the data has a data amount reaching a billion rows, e.g., a data amount corresponding to 48 GB.

[Displacement Amount (Binary Data)]

Next, the correction value calculation unit 12 compresses the displacement amount (ASCII data) as in the text data (step S4), and temporarily stores said displacement amount in the storage unit 4. Furthermore, the correction value calculation unit 12 converts the compressed displacement amount (ASCII data) into the displacement amount (Binary data) of 8-bit Binary data format (step S5). The correction value calculation unit 12 reduces the data amount of the displacement amount by converting the displacement amount of ASCII data to the displacement amount of Binary data. Thereby, the data of the displacement amount is changed to a format which allows for easy operation.

[Correction Map by Non-Uniform Mesh]

Next, the correction map generation unit 13 obtains the displacement correction value from the displacement amount (Binary data), and generates a correction map by a non-uniform mesh (step S6).

First, with reference to FIGS. 8A, 8B, 9A, 9B, 10A, and 10B, the correction map by a non-uniform mesh will be described in detail. Herein, in the above-described cell region 32, a displacement correction value for a displacement amount toward the Y-axis direction from the cell region end 32a on the circuit element region 33 side to the cell region end 32b will be described.

Figure 8A:
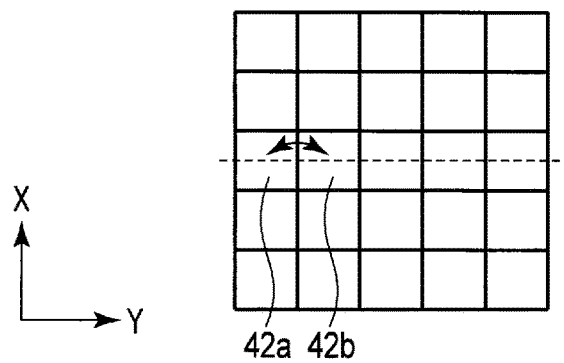
FIG. 8A is a diagram showing a uniform mesh to be set in a divided cell region based on a measurement point of stress.

The uniform meshes shown in FIGS. 8A and 10A and the non-uniform mesh shown in FIG. 9A will be described. FIGS. 8A, 9A, and 10A each show a form of mesh, and FIGS. 8B, 9B, and 10B each show distribution of the same displacement correction values for correcting the displacement. In the following descriptions, one grid in the mesh of the correction map is assumed to be a correction region. This correction region has a shape surrounded by orthogonal X and Y axes, and has a rectangular shape in principal.

The correction map shown in FIG. 8A is constituted by a basic uniform mesh of the same size. This correction map shows an example of dividing a region to be corrected by 5 blocks×5 blocks, which is set based on the distribution (distances between measurement points) of the measurement points to measure stress. Each block is a correction region of the same size.

Figure 8B:
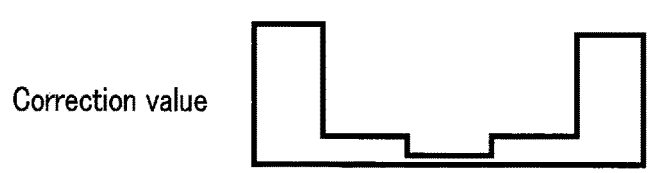
FIG. 8B is a diagram showing a displacement correction value along a Y-axis direction in FIG. 8A.

A displacement correction value obtained from a displacement amount (Binary data) calculated for every correction region is an average value within one block as shown in FIG. 8B. Thus, for example, a relatively large correction value difference may exist between a correction region 42a and a correction region 42b. When generating a photo mask by a correction mask pattern with this correction value difference, a resist mask having level differences is generated. Namely, for example, when interconnects are formed by a semiconductor manufacturing process using this resist mask, an interconnect pattern having level differences (bends) is formed. Thus, the correction mask pattern is subjected to interpolation processing to fill the level differences so as to have a linearly smooth change without large level differences. By a general conventional technique, this interpolation processing is performed repeatedly for the entire set of correction regions with a uniform mesh of the same size as a reference until reaching the initially-set correction value difference, as shown in FIG. 10A. For example, when the correction value difference is set to lower than 1 nm, even if only one correction value difference among the entire set of correction regions exceeds 1 nm, the interpolation processing is performed again for the entirety of said correction regions, resulting in the correction regions of a smaller size.

Figure 11:
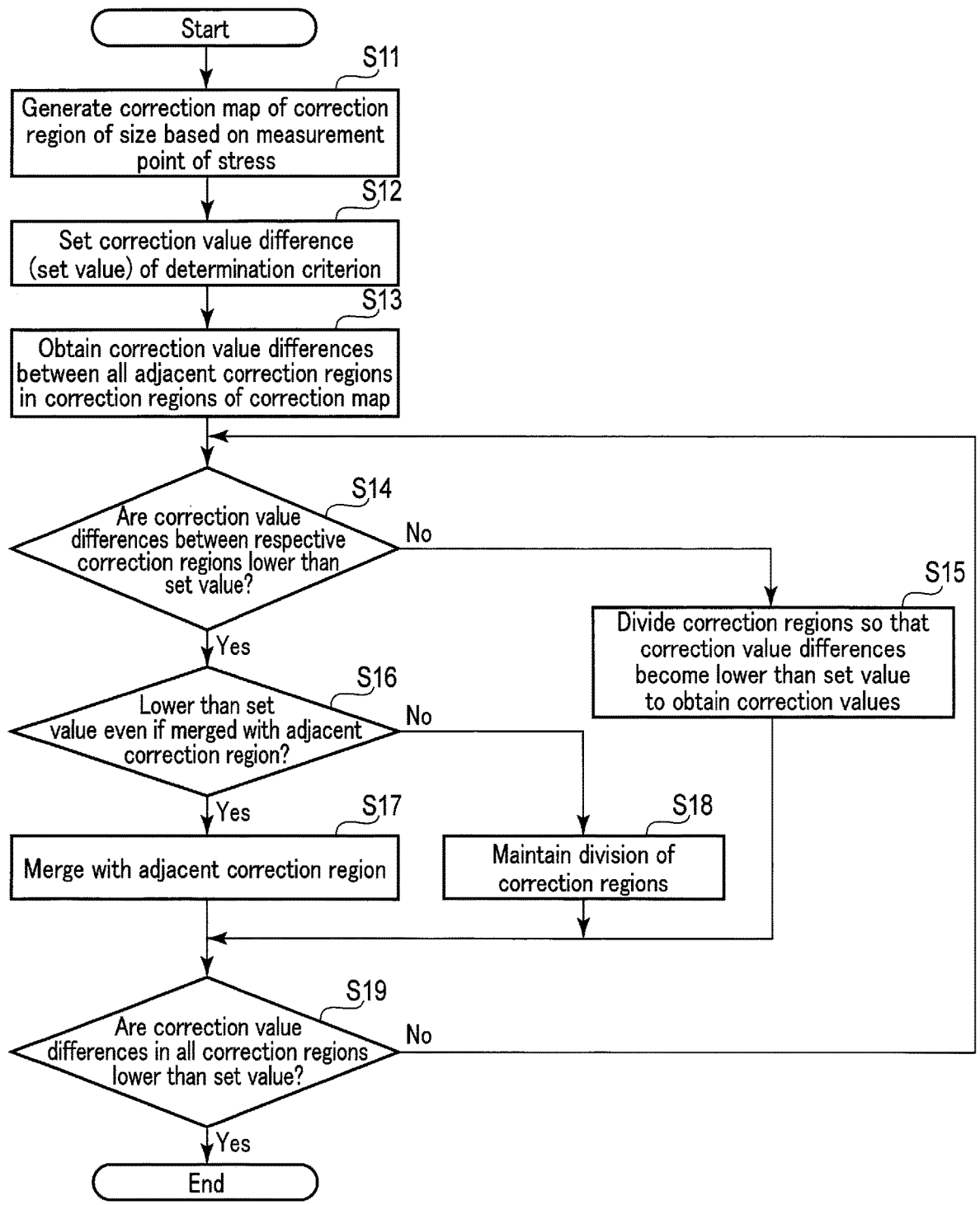
FIG. 11 is a flowchart for explaining a preparation of a correction map by a non-uniform mesh.

Herein, generation of a correction map by a non-uniform mesh in the present embodiment will be described with reference to the flowchart shown in FIG. 11.

The size of a correction region in the non-uniform mesh of the present embodiment is determined by displacement correction values of adjacent correction regions. If a correction value difference of displacement correction values between adjacent correction regions is lower than a set value, said correction regions are merged. On the other hand, if the correction value difference is equal to or greater than the set value, said correction regions are divided so that a change in their displacement correction values approximates a linear form. Thus, the size of the correction region differs depending on the magnitude of the correction value difference.

First, as described above, a displacement correction value is obtained from a displacement amount (Binary data), and a correction map of the mesh size according to the correction regions based on the measurement points of stress as shown in FIG. 8A is generated (step S11).

Next, as an example of a determination criterion of interpolation completion, an upper limit (set value) is set so that a correction value difference between adjacent correction regions is lower than 1 nm at the maximum (step S12). This upper limit (the maximum value) is set so as to interpolate until the correction value difference becomes lower than 1 nm.

In FIG. 6, as indicated by the arrows, displacement correction values among all the adjacent correction regions are compared to obtain correction value differences (step S13).

Next, it is determined whether or not each of the calculated correction value differences among the correction regions is lower than the set value (step S14). In the determination of this step S14, if the correction value difference is equal to or greater than the set value (NO), the correction regions are divided between the adjacent correction regions so that the correction value difference becomes lower than the set value. Furthermore, a displacement correction value is obtained again for each of the divided correction regions (step S15).

Figure 9B:
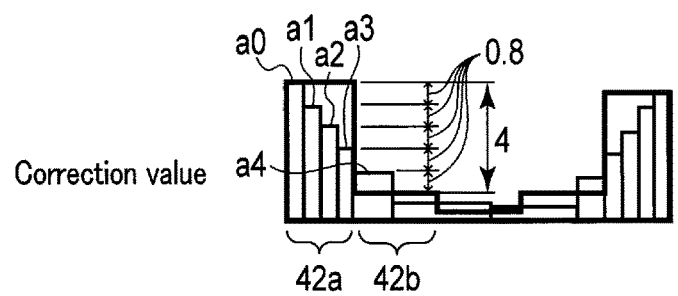
FIG. 9B is a diagram showing a displacement correction value divided by a non-uniform mesh along a Y-axis direction in FIG. 9A.
Figure 10A:
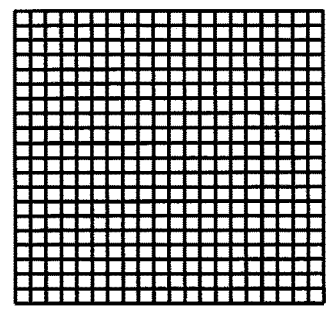
FIG. 10A is a diagram showing a correction map by division of a conventional uniform mesh.
Figure 10B:
FIG. 10B is a diagram showing a displacement correction value divided by a uniform mesh along a Y-axis direction in FIG. 10A.

For example, in FIG. 9B, it is assumed that a correction value difference between the correction region 42a and the correction region 42b is approximately 4 nm. In order to make the correction value difference, 4 nm, lower than the set value, 1 nm, for example, the correction regions are divided into five correction regions, a0, a1, a2, a3, and a4, of 0.8 nm each. As a matter of course, the correction regions are not limited to the equal-width regions, and can be changed appropriately according to the displacement correction values of the adjacent correction regions. Since the correction region a4 is merged with a part of the other adjacent correction region 42b, the size thereof is large. When these divided correction regions a0, a1, a2, a3, and a4 are applied to portions of level differences between the correction region 42a and the correction region 42b, the division of the correction regions shown in FIGS. 9A and 9B is set.

In addition, in the determination of step S14, when the correction value difference is lower than the set value (YES), even if the adjacent correction regions are merged, it is determined whether or not a correction value difference between the merged correction regions and another correction region adjacent thereto is maintained to be lower than the set value (step S16). In the determination of step S16, if there is no correction value difference between the adjacent correction regions, or the correction value difference between the adjacent correction regions is lower than the set value, the two correction regions are merged to be treated as one correction region. If the adjacent correction regions are merged, respective displacement correction values are added, and an average value is set as a new displacement correction value.

An average value of displacement correction values may be set in consideration of a ratio of areas of correction regions to be merged. However, when the correction regions have different displacement correction values, if an average value of the two correction regions is obtained, the displacement correction value of one becomes smaller and the displacement correction value of the other, larger. When the displacement correction value changes, even if a correction value difference between the merged correction regions and another correction region (a correction region that is not merged) adjacent thereto is lower than a set value (1 nm) prior to merging of the merged correction regions, it might exceed the set value post-merging. Accordingly, the above-described determination of step S16 is employed.

In the determination of step S16, even if the adjacent correction regions are merged, when the correction value difference between the merged correction regions and another correction region adjacent thereto is lower than the set value (YES), said adjacent correction region is merged (step S17). In contrast, in the determination of step S16, if the correction value difference exceeds the set value (NO), the current divided state of these correction regions is maintained without merging said adjacent correction region (step S18). Namely, neither merging nor division of the adjacent correction region is performed.

Next, in all the correction regions including the merged and divided ones, it is determined whether or not the correction value difference between the adjacent correction regions is lower than the set value (step S19). In the determination of step S19, if the correction value difference between the adjacent correction regions is lower than the set value (YES), a series of sequences is finished. Thereby, a correction map by a non-uniform mesh is generated. On the other hand, in the determination of step S19, when there are adjacent correction regions whose correction value difference is equal to or greater than the set value (NO), the process returns to step S14, and the processes of step S14 and subsequent steps are performed, i.e., the division of the correction regions is performed again.

In addition, in the merging of adjacent correction regions, for example, when a correction value difference between the adjacent correction region 42b and correction region 42c is lower than the set correction value difference (the set value), these correction regions can be merged. However, since it is affected by the correction value difference between the adjacent correction region 42d and neighboring correction region 42e, the correction region 42b and the correction region 42c would not be merged in the current mesh size, and the position of division of correction regions might be newly set.

Figure 7:
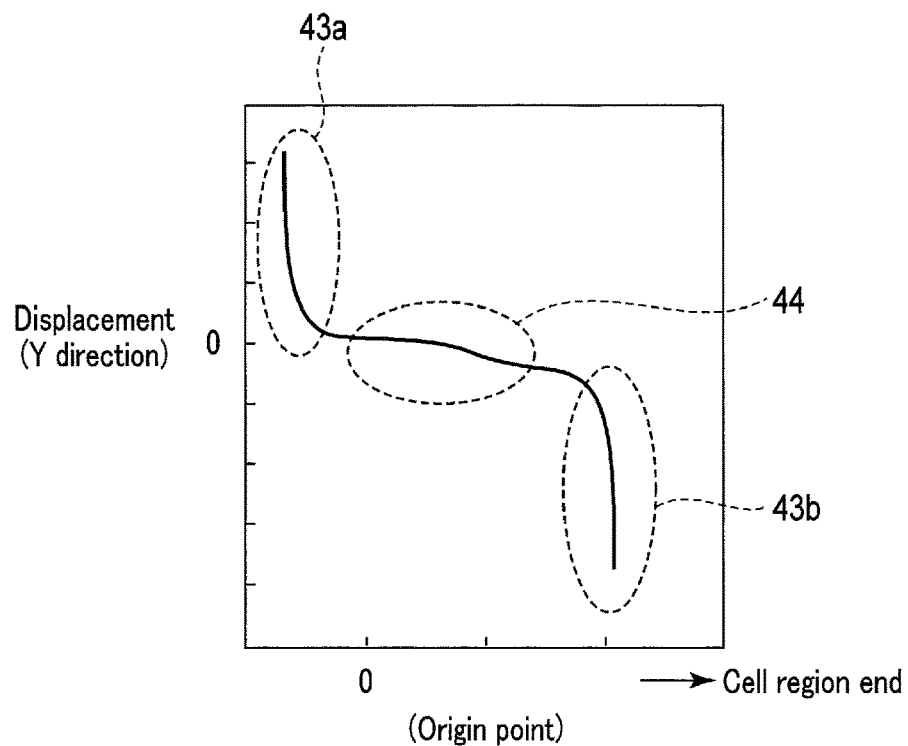
FIG. 7 is a diagram for explaining the size of a correction region.

In the non-uniform mesh of the present embodiment, as shown in FIG. 7, end regions 43a and 43b, located at both ends in the correction region and each having a large change in displacement correction value, are divided into a small-sized fine mesh. In addition, a center area 44, with less change in displacement correction value and located at the center of the correction region, is merged with an adjacent correction region, and thus divided into a large-sized coarse mesh.

From the above, the number of non-uniform mesh correction regions shown in FIG. 9A is remarkably smaller than the number of non-uniform mesh correction regions shown in FIG. 10A. Namely, the data amount of table data in a correction map to be used for mask position correction is reduced.

As described above, the correction map generation unit 13 of the present embodiment generates a correction map constituted of position information (coordinate information indicating the position and size of the correction region) of the correction region and table data from the displacement correction value by a non-uniform mesh generated from the displacement information (Binary data) of Binary data format. Accordingly, since the correction map is table data, the data size is small. For example, it is possible to provide a correction map constituted of table data of 0.05 GB from displacement information (Binary data) of 48 GB. Usually, OASIS-form image data used for a correction map provides a correction map of 5 GB from displacement information (Binary data) of 48 GB. Thus, by using table data for a correction map to be used for mask position correction, the data size becomes small. Furthermore, table capacitance to be stored in the storage unit 4 can be reduced, and data handling in writing and reading can be performed in a short time. Since the number of correction regions is also reduced, processing time of position correction could be shortened. In this way, by reducing the data size, a load for arithmetic processing on the control unit 3 can be mitigated, the operation time can be shortened, and processing speedups can be expected.

[Mask Position Correction]

With reference back to FIG. 2, displacement correction of a mask pattern will be described.

The design layout (layout data) of the originally-designed mask pattern is, for example, generated by GDS (Graphic Data System), which is one of the mask data formats. This design layout is, for example, subjected to optical proximity correction (OPC) to correct the design layout, so that a transfer pattern as designed can be formed (step S7).

Next, based on the corrected design layout (OPC layout), a mask pattern (mask design data) is generated (step S8).

After that, with respect to the mask design data, which is a mask pattern based on the design value, displacement of the mask pattern generated based on the OPC layout is corrected by the mask position correction unit 14, using table data including moving amount information for position correction using a correction map (step S9).

In the present embodiment, the displacement of the mask pattern (transfer pattern) is corrected after being subjected to the optical proximity correction, but the procedure is not limited thereto. By reversing the procedure, the optical proximity correction may be performed after first performing the mask pattern displacement correction the present embodiment, it is assumed that the table data including the displacement information and the correction value (mask correction value) from the correction map are matched. However, the displacement amount described herein is a measured amount of a circuit pattern formed on a chip, and the correction value is a displacement amount with respect to the design pattern. Accordingly, with the same portion on the circuit pattern as a reference, for example, the displacement correction value differs depending on whether the center or side surface of a hole is used as a reference. Thus, the table data and the correction value may be associated and set.

Figure 13:
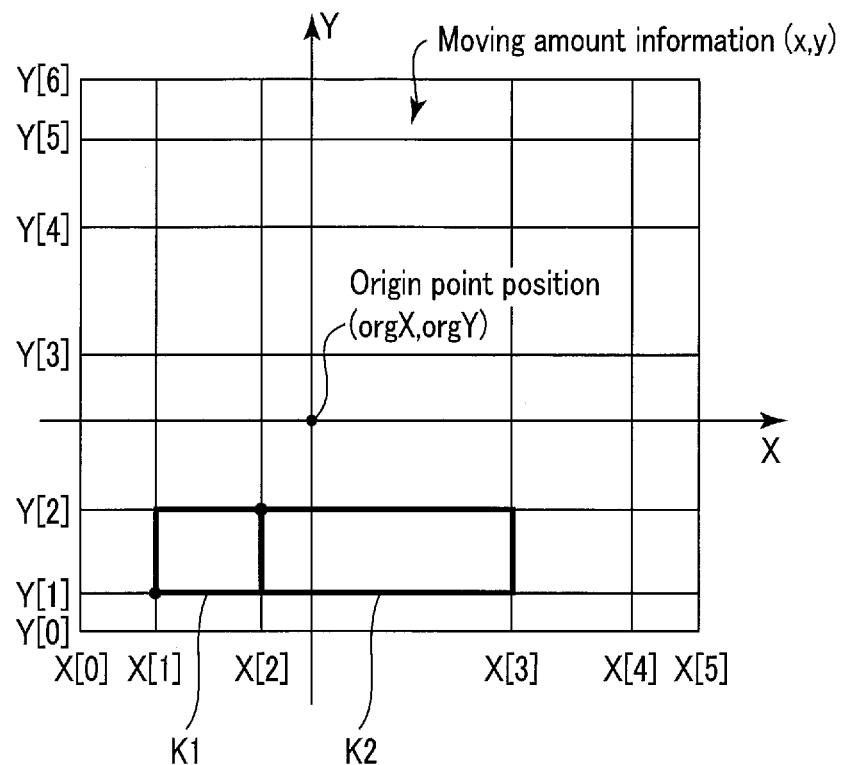
FIG. 13 is a diagram showing, as a figure, table data including moving amount information for explaining displacement correction.

This table data is configured so that, based on the correction map (mesh), a correction region and a moving amount in the size (coordinate information) set by the displacement correction value can form a figure shown in FIG. 13. The moving amount includes a moving distance by the displacement correction value and a moving direction which is a reverse direction of the direction in which stress acts. The figure of FIG. 13 formed by this table data is matched with mask design data in which design data for forming the mask pattern shown in FIG. 14 are arranged in plural.

Figure 14:
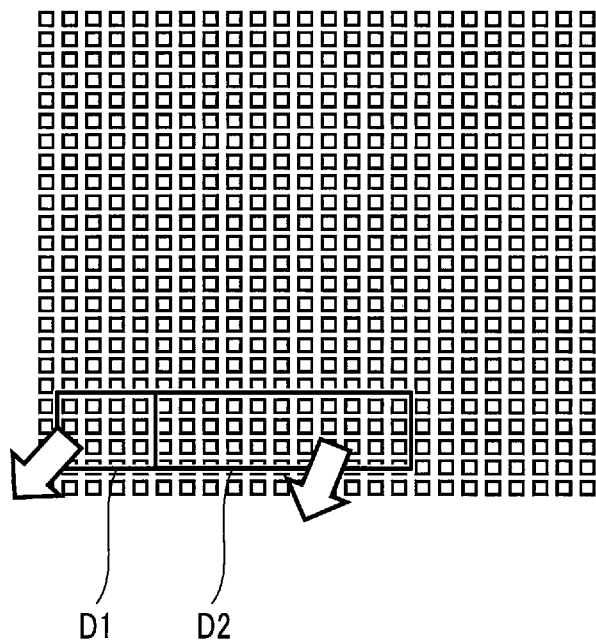
FIG. 14 is a diagram showing an example of mask design data to be displacement-corrected.

Accordingly, for example, when a correction region K1 (coordinates X[1]Y[1], X[2]Y[2]) of the table data shown in FIG. 13 is applied to the mask design data shown in FIG. 14, a data division, region D1 is set. The correction region K1 is applied, and a plurality of design data included in the data division region D1 are set as correction targets. Furthermore, a moving distance and a moving direction are uniformly set to each design data within the data division region D1, in accordance with the moving amount set in the correction region K1 of the table data. Namely, in one step of applying the correction region K1 of the table data to the mask design data, design data to be moved is selected, and a moving amount thereof is set.

In the conventional displacement correcting processing using OASIS data, first, by using a correction map of image data by a uniform mesh with a large amount of data, image arithmetic processing for extracting a region to move using a design pattern and the correction map is performed. Next, with respect to the extracted region, it is necessary to perform graphic arithmetic processing in order to move the position.

In addition, the present embodiment may be used for the processing of fitting the mask design data to every correction region of the table data. As one method, however, by using an existing data conversion system, for example, the mask design data may be divided into a plurality of equal parts to fragmentarily fit frame lines of the correction regions of the table data according to divided mask design data equally divided. The mask design data need not necessarily be divided into equal parts. For example, it may be defined by the number of fragmentary frame lines of correction regions fitted within the divided mask design data, and the mask design data may be divided into plural in such a manner that the number of frame lines does not exceed a set number.

In an example shown in FIG. 12, the mask design data is divided into, for example, about 20 calculation regions of the size of 1 mm square. However, the number of correction regions and the size of this divided mask design data are discretionary, and can be set appropriately according to the processing capability of the system, the mask size, and the information amount of the mask design data.

Next, to disperse the respective divided mask design data, processing to fragmentarily fit the frame lines of the correction regions of the table data is performed by independent calculators 1, 2, and 3 in parallel. The independent calculators are, for example, equivalent to a function of performing arithmetic processing simultaneously in parallel within one computer. In this processing of fragmentarily fitting the frame lines of the correction regions of the table data to the divided mask design data, by providing a dedicated command, the correction regions can be directly moved to the divided mask design data. Thus, the overhead time required for each occasion on which the fitting processing is performed can be significantly shortened. In addition, by executing the fitting processing to the divided mask design data simultaneously and in parallel, the time for allocating the correction regions of the table data to the mask design data can be shortened. In addition, the number of times fitting processing is performed does not depend on the number of correction regions, but on the number of divisions of the divided mask design data equally divided. Thus, there is no dependence on the number of correction regions, no variation in processing time, and said processing time would not increase even if the number of correction regions amounts to a considerable number.

As described above, according to the mask pattern correction system 1 of the present embodiment, the number of measurement data is reduced through stress analysis and data interpolation, while processing time is shortened and mask pattern correction accuracy is improved.

Figure 15:
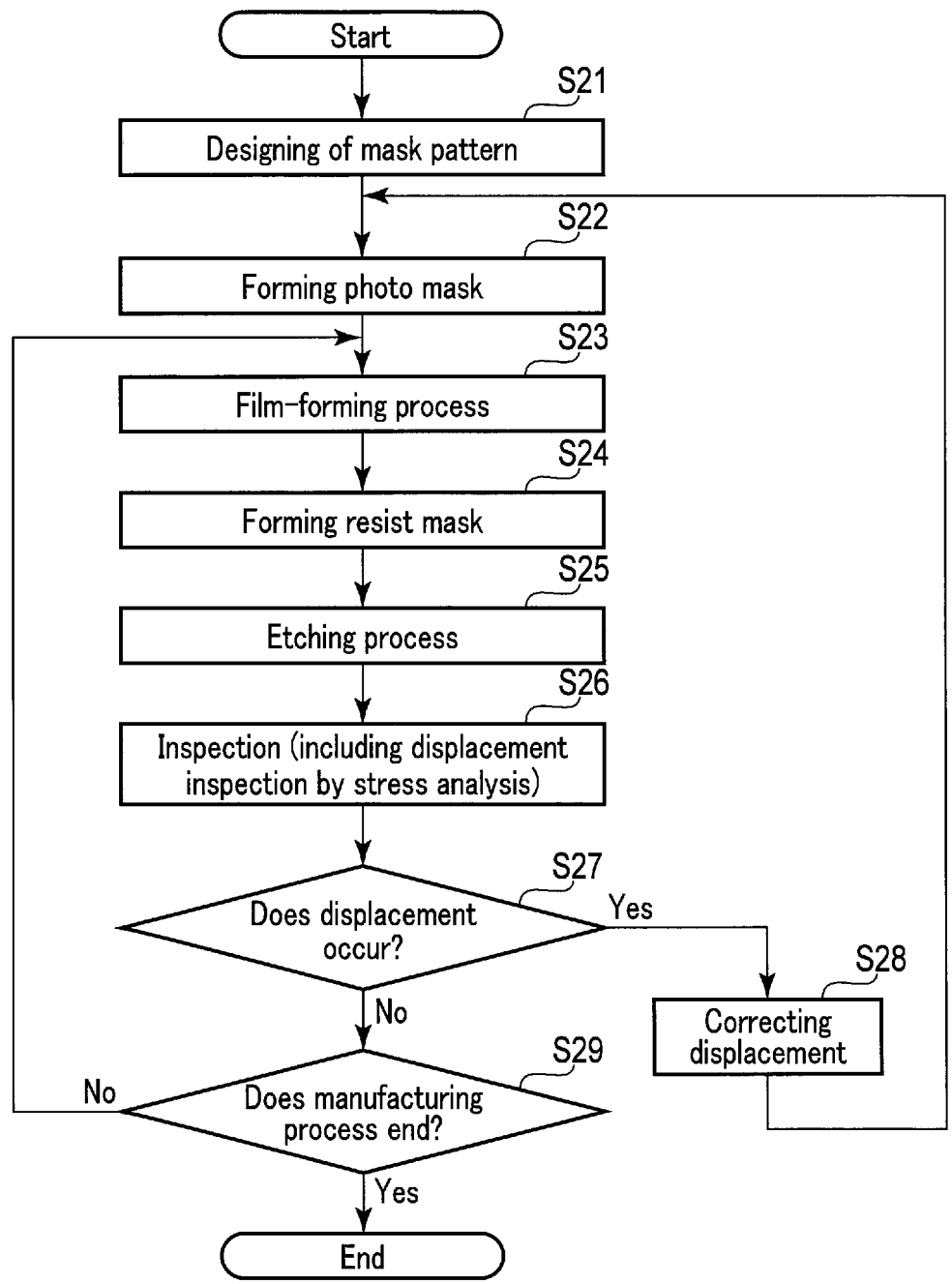
FIG. 15 is a flowchart for explaining an example in which the mask pattern correction method of the present embodiment is applied to a manufacturing process of a semiconductor device.

Next, an example in which the mask pattern correction method of the present embodiment is applied to a manufacturing process of a semiconductor device will be described with reference to the flowchart shown in FIG. 15. This flowchart indicates the manufacturing process of the semiconductor device conceptually.

First of all, designing of a mask pattern for forming a circuit pattern of each layer is performed based on a lamination structure of the semiconductor device to be manufactured, and mask design data is generated (step S21). Furthermore, a design photo mask is formed in accordance with the designed mask design data by using an electron beam drawing apparatus, etc. In the case of processing transferred from step S28 (to be described later), a correction photo mask is formed in accordance with displacement-corrected mask correction data (step S22).

Next, a film-formation process by using a film-forming device, such as a chemical vapor deposition (CVD) device or a sputtering device, is executed on a semiconductor substrate into which an impurity layer is introduced by ion injection processing, etc., and a thin film (conductive film or insulating film) is formed on the semiconductor substrate (step S23). In addition, depending on the thin film formed, heat processing, such as anneal processing, might be performed after the film-forming processing.

Thereafter, by a photolithography technique, exposure is performed on a resist film applied on the thin film by using the above-described design photo mask or correction photo mask to form a resist mask on said thin film (step S24). For the semiconductor substrate on which the resist mask is formed, an etching process is performed by an etching device to partially remove an unnecessary thin film (step S25). After the etching process is finished, the remaining resist mask is peeled off.

Next, an inspection is performed for the formed circuit pattern or circuit element through use of a measurement equipment, such as a scanning electron microscope (SEM) and a scanning tunnel microscope (STM) (step S26). In addition to the above, inspections of physical properties and shape are performed for the thin film formed. Measurement data generated in this inspection includes shapes of a circuit pattern and a circuit element, and position information of a forming position. With the mask pattern correction system 1 of the present embodiment, displacement information is acquired by performing stress analysis on measurement data via an existing processing program.

Next, it is determined whether displacement occurs in the acquired displacement information (step S27). If it is determined that displacement occurs in this step S27 (YES), displacement of the above-described mask pattern (mask design data) is corrected (step S28). Thereafter, the process returns to step S22, and the processing of step S22 and thereafter are performed. Namely, a correction photo mask is formed in accordance with displacement-corrected mask correction data (step S22), and the subsequent processing is performed.

The determination that displacement does not occur in step S27 (NO) then determines whether or not the manufacturing process is finished (step S29). If the manufacturing process of the semiconductor device is finished (YES), a series of sequences is finished. In addition, if the manufacturing process of the semiconductor device is unfinished (NO), the process returns to step S23, and the manufacturing processes of step S23 and thereafter are continued.

As described above, by applying the mask pattern correction method of the present embodiment to the manufacturing process of the semiconductor device, for a multi-layered semiconductor device, displacement of a circuit pattern and a circuit element due to stress generated in manufacturing is corrected for each layer so as to achieve a lamination structure as designed. Especially, disconnection of interconnects between laminated layers and configuration failure of a circuit element due to displacement can be eliminated. In the present embodiment, since the displacement correction value using stress analysis and the size of the correction region are calculated, time required for displacement detection and displacement correction can be shortened. Thus, time required for manufacturing the semiconductor device can also be shortened.

While certain embodiments have been described, these embodiments have been presented by way of example only, and are not intended to limit the scope of the inventions indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A mask pattern correction system comprising:
   a stress analysis circuitry configured to divide a layout of a first circuit pattern formed on a substrate using a design photo mask formed in accordance with mask design data into a plurality of correction regions, and to acquire a displacement amount by a stress analysis from measurement data including position information of the correction regions;
   a correction value calculation circuitry configured to calculate a displacement correction value in the correction regions from the displacement amount;
   a correction map generation circuitry configured to generate a correction map including the correction regions based on a first correction value difference of the displacement correction values between the correction regions that are mutually adjacent in the correction regions; and
   a mask position correction circuitry configured to allocate the correction regions in the correction map to a layout of the first circuit pattern, to perform displacement correction of a mask pattern on the design photo mask by the displacement correction values, and to create a correction photo mask based on the displacement correction.

2. The mask pattern correction system according to claim 1, wherein
   the correction value calculation circuitry calculates the displacement correction value from a displacement amount obtained by converting the displacement amount acquired by the stress analysis circuitry to Binary data format.

3. The mask pattern correction system according to claim 1, wherein
   the correction map generation circuitry compares the first correction value difference of the displacement correction values between the correction regions, and a first value,
   when the first correction value difference is lower than the first value, and the adjacent correction regions are merged, if a second correction value difference of displacement correction values between the merged correction regions and a correction region adjacent to the merged correction regions is lower than the first value, the adjacent correction region is merged; and if the second correction value difference is equal to or greater than the first value, the adjacent correction region is not merged, and if the first correction value difference is equal to or greater than the first value, the adjacent correction region is divided so that the first correction value difference is set to lower than the first value.

4. The mask pattern correction system according to claim 1, wherein the stress analysis circuitry acquires stress distribution from the measurement data by a simulation, and converts stress generated from the stress distribution to the displacement amount.

5. The mask pattern correction system according to claim 2, wherein the displacement correction value calculated by the correction value calculation circuitry corresponds to a moving amount, including a moving distance and a moving direction of changing a layout of the mask pattern on the correction photo mask, so that positions for forming an interconnect and a circuit element of the first circuit pattern match positions for forming an interconnect and a circuit element of a circuit pattern to be formed in an upper layer of the first circuit pattern or a layer at the same height as the first circuit pattern.

6. The mask pattern correction system according to claim 1, wherein the correction map is divided in a non-uniform mesh form.

7. A semiconductor device manufacturing method comprising:

dividing a layout of a first circuit pattern formed on a substrate using a design photo mask formed in accordance with mask design data, into a plurality of correction regions;

acquiring a displacement amount by a stress analysis from measurement data including position information of the correction regions;

calculating a displacement correction value in the correction regions from the displacement amount;

generating a correction map including the correction regions based on a first correction value difference of the displacement correction values between the correction regions that are mutually adjacent in the correction regions;

allocating the correction regions in the correction map to a layout of the first circuit pattern;

performing displacement correction of a mask pattern on the design photo mask from the displacement correction values; and forming a correction photo mask based on the displacement correction.

8. The semiconductor device manufacturing method according to claim 7, wherein calculating the displacement correction value includes calculating a displacement correction value from a displacement amount obtained by converting the displacement amount to Binary data format.

9. The semiconductor device manufacturing method according to claim 7, wherein generating the correction map includes:

comparing the first correction value difference of the displacement correction values between the correction regions, and a first value;

when the first correction value difference is lower than the first value, and the adjacent correction regions are merged, if a second correction value difference of displacement correction values between the merged correction regions and a correction region adjacent to the merged correction regions is lower than the first value, the adjacent correction region is merged, and if the second correction value difference is equal to or greater than the first value, the adjacent correction region is not merged; and if the first correction value difference is equal to or greater than the first value, the adjacent correction region is divided so that the first correction value difference is set to lower than the first value.

10. The semiconductor device manufacturing method according to claim 7, wherein acquiring the displacement amount includes acquiring stress distribution from the measurement data by a simulation, and converting stress generated from the stress distribution to a displacement amount.

11. The semiconductor device manufacturing method according to claim 8, wherein the displacement correction value is a moving amount including a moving distance and a moving direction of change to a layout of a mask pattern on the correction photo mask, so that positions for forming an interconnect and a circuit element of the first circuit pattern match positions for forming an interconnect and a circuit element of a circuit pattern to be formed in an upper layer of the first circuit pattern or a layer at the same height as the first circuit pattern.

12. The semiconductor device manufacturing method according to claim 7, wherein the correction map is divided in a non-uniform mesh form.

13. A non-transitory computer readable storage medium storing a program, the program enabling steps comprising:

dividing a layout of a first circuit pattern formed on a substrate using a design photo mask formed in accordance with mask design data, into a plurality of correction regions;

acquiring a displacement amount by a stress analysis from measurement data including position information of the correction regions;

calculating a displacement correction value in the correction regions from the displacement amount;

generating a correction map including the correction regions based on a first correction value difference of the displacement correction values between the correction regions that are mutually adjacent in the correction regions; and allocating the correction regions in the correction map to a layout of the first circuit pattern;

performing displacement correction of a mask pattern on the design photo mask from the displacement correction values; and forming a correction photo mask based on the displacement correction.

14. The non-transitory computer readable storage medium according to claim 13, wherein calculating the displacement correction value includes calculating a displacement correction value from a displacement amount obtained by converting the displacement amount to Binary data format.

15. The non-transitory computer readable storage medium according to claim 13, wherein
generating the correction map includes:
comparing the first correction value difference of the displacement correction values between the correction regions, and a first value;
when the first correction value difference is lower than the first value, and the adjacent correction regions are merged, if a second correction value difference of displacement correction values between the merged correction regions and a correction region adjacent to the merged correction regions is lower than the first value, the adjacent correction region is merged, and if the second correction value difference is equal to or greater than the first value, the adjacent correction region is not merged; and
if the first correction value difference is equal to or greater than the first value, the adjacent correction region is divided so that the first correction value difference is set to lower than the first value.

16. The non-transitory computer readable storage medium according to claim 13, wherein
acquiring the displacement amount includes acquiring stress distribution from the measurement data by a simulation, and converting stress generated from the stress distribution to a displacement amount.

17. The non-transitory computer readable storage medium according to claim 14, wherein
the displacement correction value is a moving amount including a moving distance and a moving direction of change to a layout of a mask pattern on the correction photo mask, so that positions for forming an interconnect and a circuit element of the first circuit pattern match positions for forming an interconnect and a circuit element of a circuit pattern to be formed in an upper layer of the first circuit pattern or a layer at the same height as the first circuit pattern.

18. The non-transitory computer readable storage medium according to claim 13, wherein
the correction map is divided in a non-uniform mesh form.

* * * * *